(12) United States Patent
van Vonno et al.

(10) Patent No.: US 7,029,981 B2
(45) Date of Patent: Apr. 18, 2006

(54) RADIATION HARDENED BIPOLAR JUNCTION TRANSISTOR

(75) Inventors: Nicolaas W. van Vonno, Melbourne, FL (US); Dustin Woodbury, Indian Harbour Beach, FL (US)

(73) Assignee: Intersil Americas, Inc., Milpitas, CA (US)

( * ) Notice: Subject to any disclaimer, the term of this patent is extended or adjusted under 35 U.S.C. 154(b) by 81 days.

(21) Appl. No.: 10/875,731

(22) Filed: Jun. 25, 2004

(65) Prior Publication Data

US 2005/0287754 A1    Dec. 29, 2005

(51) Int. Cl.
*H01L 29/732* (2006.01)

(52) U.S. Cl. ............... 438/326; 438/953; 438/140; 257/630

(58) Field of Classification Search .......... 438/140, 438/953, 326; 257/630
See application file for complete search history.

(56) References Cited

U.S. PATENT DOCUMENTS

| | | | |
|---|---|---|---|
| 4,050,965 A * | 9/1977 | Ipri et al. ................. 438/154 |
| 4,086,610 A * | 4/1978 | Clark et al. ............... 257/592 |
| 4,089,022 A | 5/1978 | Asai et al. |
| 4,590,664 A * | 5/1986 | Prentice et al. ........... 438/328 |
| 4,825,278 A * | 4/1989 | Hillenius et al. .......... 257/630 |
| 4,858,184 A * | 8/1989 | Homma et al. ............ 365/174 |
| 4,864,379 A * | 9/1989 | Schade, Jr. ................ 257/547 |
| 4,900,693 A * | 2/1990 | Manning ................... 438/223 |
| 5,200,347 A * | 4/1993 | Wang et al. ............... 438/309 |
| 5,851,864 A * | 12/1998 | Ito et al. ................... 438/203 |

OTHER PUBLICATIONS

E. W. Enlow, et al.: "Response of advanced bipolar processes to ionizing radiation," *IEEE Trans. Nuc. Sci.*, vol. 38, p. 1342 (Dec. 1991).

(Continued)

*Primary Examiner*—Bradley K. Smith
*Assistant Examiner*—Steven Fulk
(74) *Attorney, Agent, or Firm*—Barnes & Thornburg LLP

(57) ABSTRACT

A method of forming bipolar junction devices, including forming a mask to expose the total surface of the emitter region and adjoining portions of the surface of the base region. A first dielectric layer is formed over the exposed surfaces. A field plate layer is formed on the first dielectric layer juxtaposed on at least the total surface of the emitter region and adjoining portions of the surface of the base region. A portion of the field plate layer is removed to expose a first portion of the emitter surface. A second dielectric layer is formed over the field plate layer and the exposed portion of the emitter. A portion of the second dielectric layer is removed to expose the first portion of the emitter surface and adjoining portions of the field plate layer. A common contact is made to the exposed first portion of the emitter surface and the adjoining portions of the field plate layer. In another embodiment, the field plate and emitter contact are formed simultaneously.

10 Claims, 4 Drawing Sheets

OTHER PUBLICATIONS

A.H. Johnston, et al.: "Enhanced damage in bipolar devices at low dose rates: Effects at very low dose rates," *IEEE Trnas. Nuc. Sci.*, vol. 43, p. 3049 (Dec. 1996).

J.L. Titus, et al.: "Enhanced low dose rate sensitivity (ELDRS) of linear circuits in a space environment," *IEEE Trans. Nuc. Sci.*, vol. 46, p. 1608 (Dec. 1999).

R. L. Pease, et al.: "Total-dose hardening of a bipolar-voltage comparator," *IEEE Trans. Nuc. Sci.*, vol. 49, p. 3180 (Dec. 2002).

M. R. Shaneyfelt, et al.: "Impact of passivation layers on enhanced low-dose-rate sensitivity and pre-irradiationelevated-temperature stress effects in bipolar linear ICs," *IEEE Trans. Nuc. Sci.*, vol. 49, p. 3171 (Dec. 2002).

N. W. van Vonno, et al.: "Correlation of the device-level accelerated and true low dose rate response of hardened bipolar junction transistors," submitted for presentation at the 2003 RADECS Conference.

* cited by examiner

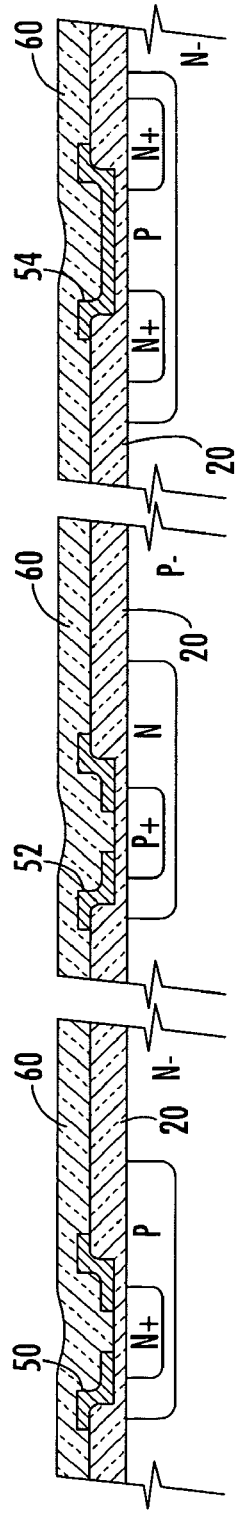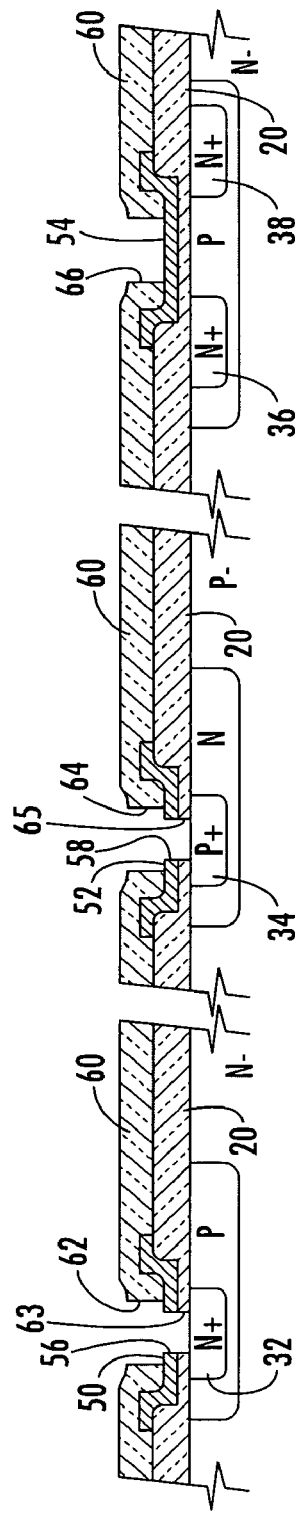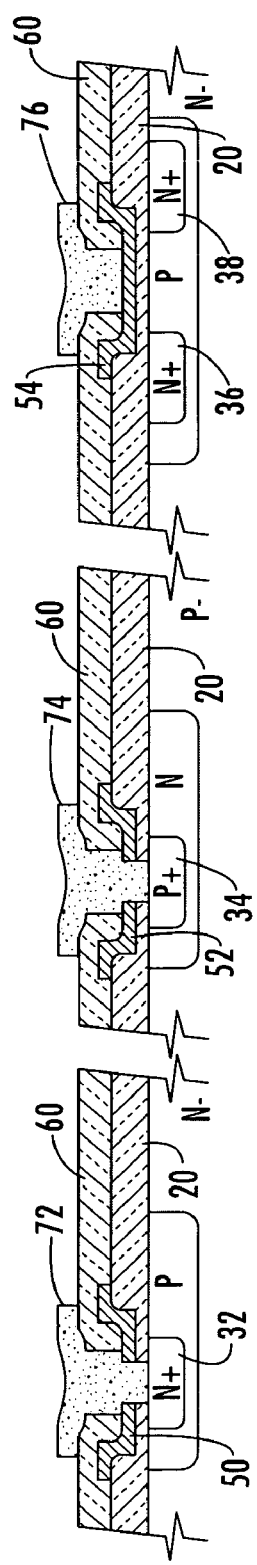

RADIATION HARDENED BIPOLAR JUNCTION TRANSISTOR

BACKGROUND AND SUMMARY OF THE DISCLOSURE

The present disclosure is related to a bipolar junction transistor and more specifically to radiation hard bipolar junction transistors in integrated circuits and their method of manufacture.

Bipolar junction transistors (BJTs) are sensitive to ionizing radiation; such radiation causes junction leakage and gain degradation. Ionizing radiation causes hole-electron pair generation in the oxide layers over the device junctions. Electrons thus generated have very high mobility in oxide and drift toward the device's terminals in picoseconds. Holes, on the other hand, have low mobility and tend to be trapped in the oxide. This causes a trapped positive charge in the oxide, which in turn leads to changes in the depletion layers and surface concentrations in the underlying device structure.

The rates of hole trapping in the oxide vary. The trapping rate determines the device's response to radiation. The trapping rate is influenced by factors such as dose rate, dielectric film stress, oxide defects, applied electric field and passivation layer characteristics. In particular, low dose rate irradiation has been found to degrade BJTs much more rapidly than the moderate dose rates used in qualification testing. See, for example:

(a) E. W. Enlow, R. L. Pease, W. E. Combs, R. D. Schrimpf and R. N. Nowlin, "Response of advanced bipolar processes to ionizing radiation," *IEEE Trans. Nuc. Sci.*, vol. 38, p. 3049, December 1991;

(b) A. H. Johnston, C. I. Lee and B. G. Rax, "Enhanced damage in bipolar devices at low dose rates: Effects at very low dose rates," *IEEE Trans. Nuc. Sci.*, vol. 43, p. 1342, December 1996; and (c) J. L. Titus et al., "Enhanced Low Dose Rate Sensitivity (ELDRS) of Linear Circuits in a Space Environment," *IEEE Trans. Nuc. Sci.*, vol. 46, p. 1608, December 1999.

This is a somewhat counterintuitive result but has turned into a major issue, as these low dose rates are exactly what is actually encountered in space. In the context of this disclosure, a moderate "qualification" dose rate is in the range of 50–300 rad(Si)/s, while a low dose rate is to the order of 0.01 rad(Si)/s. The reason for using the "qualification" dose rate is a logistical one—a lot qualification to a 300 rad(Si) specification takes an afternoon at 300 rad(Si)/s, and three months at 0.01 rad(Si)/s.

The present disclosure addresses the enhanced sensitivity of BJTs to the low dose rate environment. Radiation sensitivity of the BJT involves inversion of the base surface near the emitter leading to emitter-base junction spreading at the $Si/SiO_2$ interface and higher base current due to increased surface recombination. The hardness of the BJT depends on the hardness of this parasitic MOSFET-like region to inversion to avoid emitter depletion spreading.

The enhanced low dose rate sensitivity (ELDRS) phenomenon is believed to revolve around higher charge trapping rates at the lower dose rates. The phenomenon is not very repeatable, with substantially different results depending on such factors as processing, fabrication facility and bias during irradiation. Transistor-level radiation testing at Intersil Corporation has shown very severe degradation of the low-current gain of the transistor after low dose rate irradiation. FIG. 1 shows a representative figure, taken from unpublished Intersil Corporation data. The figure shows forward beta versus collector current for an NPN device irradiated at 10 mrad(Si)/s at room temperature. The upper curve represents the pre-irradiation data, while the three lower curves represent the 25 krad(Si), 50 krad(Si) and 100 krad(Si) data, respectively. This data indicates that designing parts to be hard in this environment would involve some difficult tradeoffs with power dissipation, as the transistors in a hardened design would need to be operated at collector current levels of one or two orders of magnitude higher than those found in the current designs.

Attempts at hardening commercial processes have included changes to or outright elimination of the passivation layer. See, for example, R. L. Pease et al., "Total-Dose Hardening of a Bipolar-Voltage Comparator," *IEEE Trans. Nuc. Sci.*, vol. 49, p. 3180, December 2002. Investigation of the effects of dielectric film stress is described in a paper by M. R. Shaneyfelt et al., 'Impact of Passivation Layers on Enhanced Low-Dose-Rate Sensitivity and Pre-Irradiation Elevated-Temperature Stress Effects in Bipolar Linear IC's,' *IEEE Trans. Nuc. Sci.*, vol. 49, p. 3171, December 2002. None of these methods have been entirely successful. One method of forming a field plate layer bridging the emitter-base junction and separated therefrom by a thin oxide layer is shown in U.S. Pat. No. 4,590,664.

Another method for hardening junction bipolar transistors in integrated circuits by changing the basic device structure is proposed in this disclosure. The method includes forming a base region in a surface of a collector region of a substrate and an emitter region in the surface of the base region. A mask is applied exposing the total surface of the emitter region and adjoining portions of the surface of the base region. A first dielectric layer is formed over the exposed surfaces. A field plate layer is formed on the first dielectric layer juxtaposed on at least the total surface of the emitter region and adjoining portions of the surface of the base region. A portion of the field plate layer is removed to expose a first portion of the emitter surface. A second dielectric layer is formed over the field plate layer and the exposed portion of the emitter. A portion of the first and second dielectric layers is removed to expose the first portion of the emitter surface and adjoining portions of the field plate layer. A common contact is made to the exposed first portion of the emitter surface and the adjoining portions of the field plate layer.

The resulting integrated circuit includes at least one bipolar junction transistor having a base region in a surface of a collector region and an emitter region in the surface of the base region. A field plate layer is juxtaposed on and separated by a first dielectric layer from adjoining portions of the surface of the base and emitter regions. A common contact is to a first portion of the emitter surface and the juxtaposed adjoining portions of the field plate layer.

Another method of forming a bipolar junction device in an integrated circuit comprises applying a mask exposing the total surface of the emitter region and adjoining portions of the surface of the base region and forming a first dielectric layer over the exposed surfaces. A portion of the first dielectric layer is removed to expose a first portion of the emitter surface. A common contact and field plate are formed to the exposed first portion of the emitter surface and on the first dielectric layer over the emitter-base junction.

In another embodiment, the bipolar junction transistor includes a common contact and field plate layer having a field plate portion juxtaposed on and separated by a first thin dielectric layer from adjoining portions of the surface of the base and emitter regions; and a contact portion extending through the first dielectric layer to a first portion of the emitter surface.

These and other aspects of the present disclosure will become apparent from the following detailed description of the disclosure, when considered in conjunction with accompanying drawings.

BRIEF DESCRIPTION OF THE DRAWINGS

FIGS. 2–8 are cross-sectional views of an integrated circuit at various stages of fabrication, according to the principles of the present disclosure.

DETAILED DESCRIPTION OF THE PREFERRED EMBODIMENTS

In prior art devices, the thick, unhardened oxide or dielectric over the emitter-base junctions of the BJT traps positive charge efficiently. If this dielectric could be made thinner, the volume available for charge trapping would be reduced, and the device hardness would improve. The thin dielectric may also be hardened by several well-known methods, which would reduce charge trapping further. Additionally, a field plate covering the junction would positively control the potential at the silicon surface. As most BiMOS processes have a thin gate oxide and a gate polycrystalline layer, the revised BJT structures can be built readily and without any additional masking levels. An example of a conventional, non-hardened thin oxide is that used for on-chip MOS capacitors.

This structure results in a field plate over the emitter-base junction, with thin oxide under the field plate. The thin oxide may be hardened or non-hardened, depending on the process being used. The field plate is connected to the emitter metallization by an oversize contact aperture. In this way, the field plate is always tied at one Vbe (about 700 mV) above or below the base, which limits the electric field at the surface. Additionally, the polarity of the applied field plate voltage will tend to enhance the surface concentration of the BJT base.

This field plate/thin dielectric structure improves the radiation hardness of the BJT structure because:
  (a) the dielectric is thin, so the total oxide volume available for hole trapping is minimized;
  (b) a hardened dielectric, if used, has controlled low hole trapping characteristics; and
  (c) the field plate controls the electric field near the surface.

The method for forming the doped regions may vary from the present process. It is only used as an example. Also, the process may include bipolar junction transistors only, without any insulated gate field effect transistors.

Figure 1:
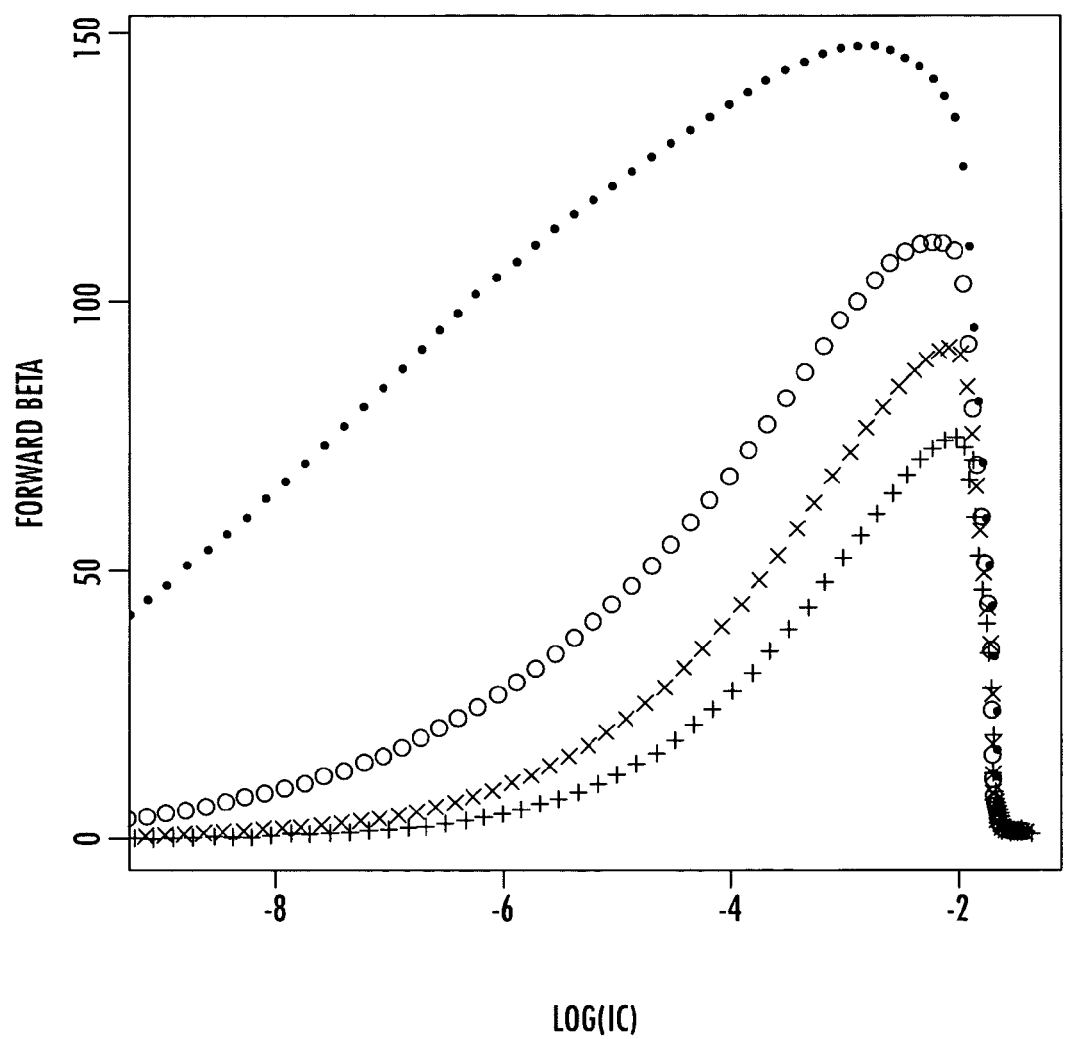
FIG. 1 is a graph of gain versus collector current as a function of low dose rate irradiation.
Figure 2:
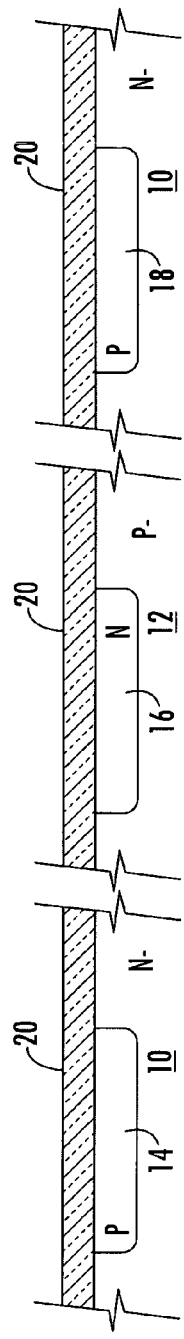

As illustrated in FIG. 2, the substrate includes two N− regions 10 and a P− region 12. One of the N− regions 10 and the P− region 12 each form the collector region of the NPN and PNP bipolar transistors. The other N− region 10 is the region in which the N− channel insulated gate field effect transistor (IGFET) is formed. P base region 14 is formed in N− collector region 10, N base region 16 is formed in P− collector region 12, and a P body portion 18 is formed in N− substrate 10. During the diffusion process, a dielectric layer 20 (for example, silicon dioxide) is deposited on the surface of the substrate.

Figure 3:
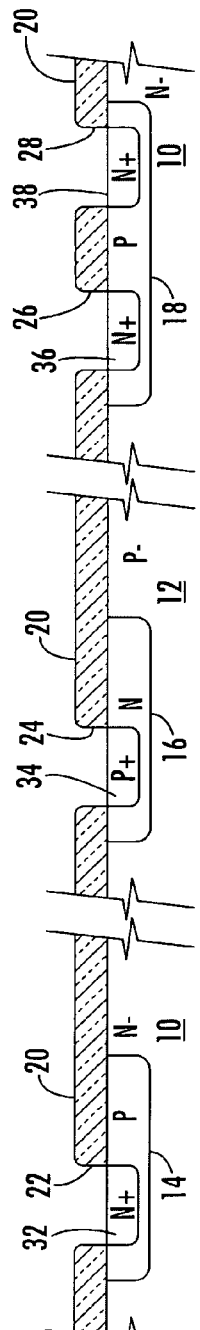
Figure 4:
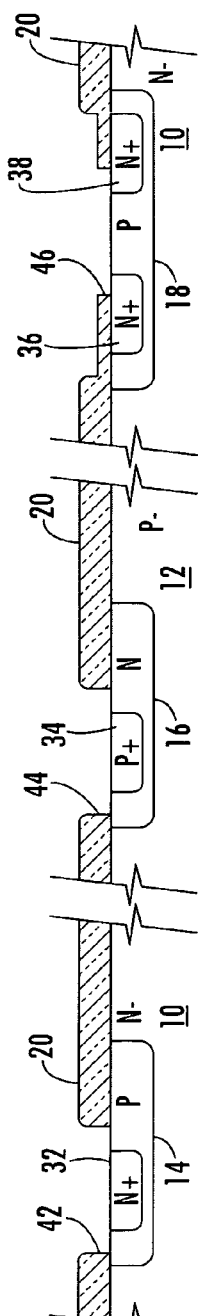

As illustrated in FIG. 3, a photoresist process is performed to form opening 24 in the dielectric layer 20. P+ impurities are then introduced through opening 24 to form emitter region 34 in base 16. Also, as illustrated in FIG. 3, a photoresist process is performed to form openings 22, 26, 28 in the dielectric layer 20. N+ impurities are then introduced through openings 22, 26, 28 to form the emitter region 32 in base 14 and the source and drain regions 36, 38 in body 18. As shown in FIG. 4, the dielectric layer 20 is then further etched to define opening 42 exposing the total surface of emitter 32 and adjoining surface areas of the base 14. Similarly, opening 44 is formed to expose the total surface of emitter 34 and adjoining regions of the base 16. The oxide layer 20 and those portions of the oxide which are formed over the source and drain regions 36, 38 are further processed to form an opening 46 in the channel region of the body 18 between the source and drain regions 36, 38. As can be seen from FIG. 4, this masking step is the same masking step for the gate oxide of the IGFET device. It would not be an additional step in integrated circuit processing. If the integrated circuit does not include insulated gate field effect transistors or other devices using a thin oxide, such as MOS capacitors, this would be an extra step in the process.

A thermally grown thin oxide layer 48 is then formed in the openings 42, 44, 46. This thin oxide is preferably a radiation hard oxide, although a non-hardened process may be used as well. The hardened thin oxide may be made radiation-hard by several well-known techniques, such as controlling the oxide growth ambient and temperature. As with the previous step, the formation of the thin oxide for bipolar transistors is the same process step to form the oxide used to form the gate insulator of the insulated gate field effect transistor. If the bipolar process was performed without insulated gate field effect transistors, other radiation hard or non-radiation hard dielectric layers, such as capacitor dielectrics, may be used.

Figure 5:
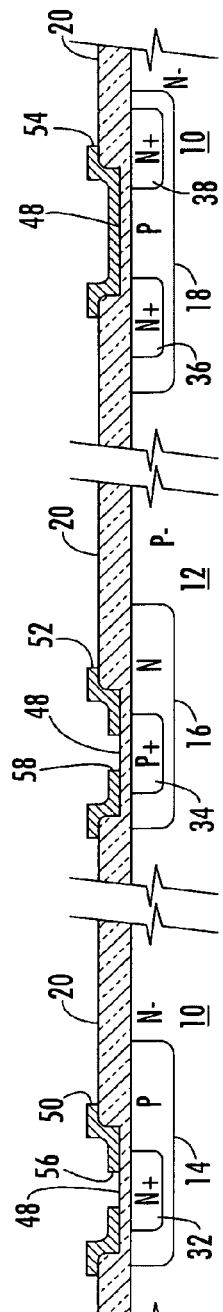

Next, as illustrated in FIG. 5, a layer of conductive material (for this example, polycrystalline silicon or metal) is applied and patterned using photoresist and etch to form field plate 50, which is juxtaposed over the total surface of emitter 32 and adjoining portions of the base 14. A similar field plate 52 extends over the total surface of the emitter 34 and adjoining portions of the base 16. The plates 50, 52 have also been patterned during the same process to form an opening 56 to expose a portion of emitter 32 and an opening 58 to expose a portion of emitter 34. As will be discussed below with respect to the emitter contact, this allows a single contact to field plates 50, 52 and the emitter regions 32, 34, respectively. The layer 54 also extends across the channel region of P body region 18 between source and drain regions 36 and 38, forming the gate of the IGFET device.

Next, the integrated circuit is covered by an inter-level dielectric 60. This is done by deposition and densification of, for example, silicon dioxide. This process is well known and is illustrated in FIG. 6. A photoresist and etch process is conducted to form openings in the inter-level dielectric 60 and the dielectric layer 20 to the regions of the integrated circuit. For purposes of clarity, only those contacts to the emitter/field plates and gates are shown in FIGS. 7 and 8. An opening 62 is formed in layer 60 exposing the portion of field plate 50 and a portion of the emitter 32 through an opening 56 in the field plate 50 at opening 63 in the dielectric layer 20. An opening 64 in the dielectric layer 60 exposes a portion of the field plate 52 and a portion of the emitter 34 through an opening 58 in the field plate 52 at opening 65 in dielectric layer 20. Opening 66 in dielectric layer 60 exposes a portion of the gate 54 of the insulated field effect transistor. All of these are shown in FIG. 7.

The interconnect layer or material (for example, metal) is applied and then delineated to form the contacts with the interconnect. As illustrated in FIG. 8, contact 72 extends down through dielectric layer 60 to come into contact with the field plate 50 and the emitter 32. It forms a common contact. Contact 74 extends through dielectric layer 60 to form a common contact with field plate 52 and emitter 34. Contact 76 extends through dielectric layer 60 and makes direct contact with the gate 54.

As previously discussed, all of the steps used to form the field plates 50, 52 extending from the emitters 32, 34 onto adjacent portions of the bases 14, 16 and to form a common contact to the field plate and the emitter regions are all part of a process to form insulated gate field effect transistors. Thus, there are no additional process steps included in those cases where the integrated circuit process includes insulated gate field effect transistors. Although not shown, the integrated circuit may also include self aligned IGFETs. The process would be the same, except the size of the gate 54 would be smaller and there would be additional steps between FIGS. 5 and 6 to form the self aligned regions of the source and drain.

Figure 11:
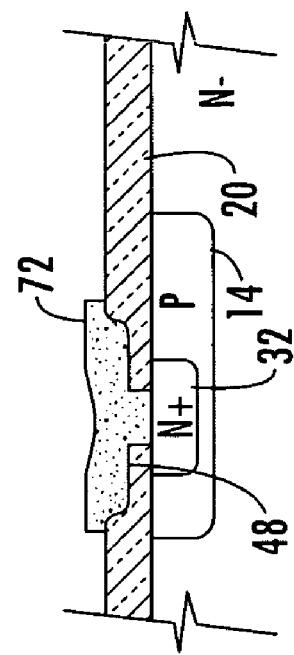
FIGS. 9–11 are cross-sectional views of an integrated circuit at various states of fabrication of another embodiment, according to the principles of the present disclosure.
Figure 9:
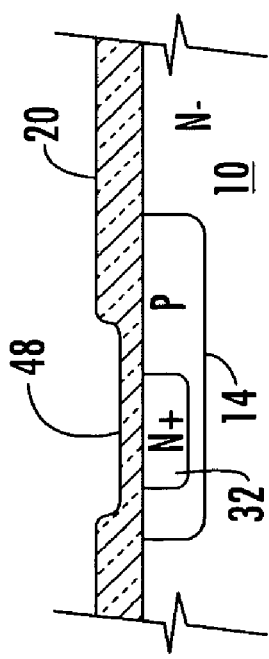
Figure 10:
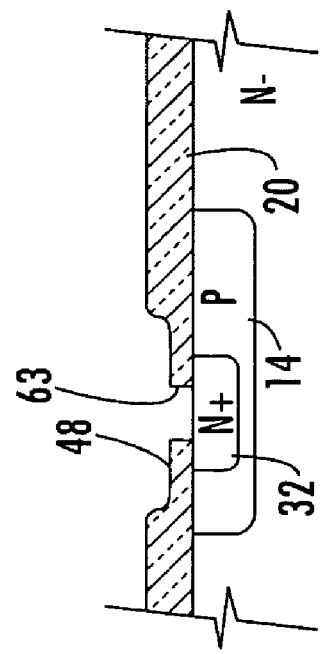

If insulated gate field effect transistors are not included, the additional steps are only that of FIGS. 4 and 5—namely, the openings 42, 44 to form the emitter base junction, the application of the dielectric layer 48, and applying the field plates 50, 52. The subsequent step of inter-level dielectric deposition of FIG. 6 would not be needed and the contact and interconnect formation steps of FIGS. 7 and 8 are part of a standard bipolar transistor process. Such a process is illustrated in FIGS. 9–11 only for the NPN transistor, but the same steps would be used for the PNP transistor. These steps correspond to the steps of FIGS. 5, 7 and 8. The thin dielectric layer 48 is formed in opening 42, as shown in FIG. 9. A photoresist and etch process is conducted to form opening 63 in the dielectric layer 20, as shown in FIG. 10. The interconnect layer or material (for example, metal) is applied and then delineated to form the contacts with the interconnect. As illustrated in FIG. 11, contact 72 extends down through dielectric layer 20 to come into contact with the emitter 32 and forms the combined field plate and emitter contact.

Although the present disclosure has been described and illustrated in detail, it is to be clearly understood that this is done by way of illustration and example only and is not to be taken by way of limitation. The scope of the present disclosure is to be limited only by the terms of the appended claims.

What is claimed is:

1. A method of forming a bipolar junction device in an integrated circuit comprising:
    forming a base region in a surface of a collector region of a substrate;
    forming an emitter region in the surface of the base region;
    forming a mask exposing the total surface of the emitter region and adjoining portions of the surface of the base region;
    forming a first dielectric layer over the exposed surfaces;
    forming a field plate layer on the first dielectric layer juxtaposed on at least the total surface of the emitter region and adjoining portions of the surface of the base region;
    removing a portion of the field plate layer to expose a first portion of the emitter surface;
    forming a second dielectric layer over the field plate layer and the exposed portion of the emitter;
    removing a portion of the first and second dielectric layers to expose the first portion of the emitter surface and adjoining portions of the field plate layer; and
    forming a common contact to the exposed first portion of the emitter surface and the adjoining portions of the field plate layer.

2. The method according to claim 1, wherein the first two steps of forming the base and emitter regions are repeated to form complementary bipolar transistors, and the remaining steps are performed simultaneously for the complementary bipolar transistors.

3. The method according to claim 1, including steps which form source and drain regions of at least one insulated gate field effect transistor in a channel region of the insulated gate field effect transistor; and wherein the steps which form the first dielectric layer and the field plate layer also form the gate insulator and the gate, respectively, of the insulated gate field effect transistor.

4. The method according to claim 3, wherein one of the steps which forms the base region and the emitter region is also used to form the source and drains of the insulated gate field effect transistor.

5. The method according to claim 1, wherein the mask formed is a third dielectric layer on the surface of the substrate with an opening to expose the total surface of the emitter region and adjoining portions of the surface of the base region.

6. The method according to claim 1, wherein the field plate layer is a polycrystalline silicon, and the contact is metal.

7. The method according to claim 1, wherein the first dielectric layer is a radiation hard layer.

8. The method according to claim 1, wherein the field plate layer and the contact are metal.

9. The method according to claim 1, wherein the first dielectric layer is a non-radiation hard layer.

10. A method of forming a bipolar junction device in an integrated circuit comprising:
    forming a base region in a surface of a collector region of a substrate;
    forming an emitter region in the surface of the base region;
    forming a mask exposing the total surface of the emitter region and adjoining portions of the surface of the base region;
    forming a first dielectric layer over the exposed surfaces;
    removing a portion of the first dielectric layer to expose a first portion of the emitter surface; and
    forming a common contact and field plate to the exposed first portion of the emitter surface and on the first dielectric layer over the emitter-base junction.

* * * * *